United States Patent [19]
Lauffer et al.

[11] Patent Number: 6,080,668
[45] Date of Patent: Jun. 27, 2000

[54] SEQUENTIAL BUILD-UP ORGANIC CHIP CARRIER AND METHOD OF MANUFACTURE

[75] Inventors: John M. Lauffer, Waverly; David J. Russell, Apalachin, both of N.Y.

[73] Assignee: International Business Machines Corporation, Armonk, N.Y.

[21] Appl. No.: 09/058,266

[22] Filed: Apr. 10, 1998

Related U.S. Application Data

[63] Continuation-in-part of application No. 08/867,712, Jun. 2, 1997, Pat. No. 5,985,760, which is a continuation of application No. 08/675,458, May 30, 1996, Pat. No. 5,665,650.

[51] Int. Cl.⁷ .................................................. H01L 21/44
[52] U.S. Cl. ........................ 438/666; 438/667; 438/106
[58] Field of Search ................................. 438/106, 455, 438/667, 672, 675, 687, 666

[56] References Cited

U.S. PATENT DOCUMENTS

| | | |
|---|---|---|
| 4,420,364 | 12/1983 | Nukii et al. . |
| 4,893,404 | 1/1990 | Shirahata et al. . |
| 4,991,060 | 2/1991 | Kawakami et al. . |
| 5,065,227 | 11/1991 | Frankeny et al. . |
| 5,078,831 | 1/1992 | Miyasaki et al. . |
| 5,079,065 | 1/1992 | Masakazu et al. . |
| 5,220,723 | 6/1993 | Okada . |
| 5,234,536 | 8/1993 | Parthasarathi et al. . |
| 5,260,518 | 11/1993 | Tanaka et al. . |
| 5,317,801 | 6/1994 | Tanaka et al. . |
| 5,462,890 | 10/1995 | Itwang et al. ............................ 438/672 |
| 5,691,238 | 11/1997 | Avanzino et al. ...................... 438/672 |
| 5,705,430 | 1/1998 | Avanzino et al. ...................... 438/672 |
| 5,776,824 | 7/1998 | Farnworth et al. ..................... 438/687 |

FOREIGN PATENT DOCUMENTS 2-45998  2/1990  Japan .

OTHER PUBLICATIONS

New Avenue for Microvias, *Electronic Engineering Times*, Mar. 18, 1996, p. 68.

*Primary Examiner*—Kevin M. Picardat
*Attorney, Agent, or Firm*—Ratner & Prestia; John R. Pivnichny

[57] ABSTRACT

A method for manufacturing electronic circuit assemblies. A layer of dielectric material is attached to a layer of electrically conductive material. Vias are formed in the layer of dielectric material and filled with conductive paste material. The resulting assembly is attached to a substrate. Because the vias are formed and filled before the dielectric layer is attached to the substrate, it is not necessary to scrap the entire multi-layer structure, which includes the substrate and all the attached layers, when a problem occurs during via formation or filling. This increases the overall yield for the entire circuit assembly manufacturing process.

29 Claims, 4 Drawing Sheets

SEQUENTIAL BUILD-UP ORGANIC CHIP CARRIER AND METHOD OF MANUFACTURE

CROSS-REFERENCE TO RELATED APPLICATIONS

This application is a continuation-in-part of U.S. patent application Ser. No. 08/867,712, filed on Jun. 2, 1997 now U.S. Pat. No. 5,985,760, which is a continuation of U.S. patent application Ser. No. 08/675,458, filed on May 30, 1996, now U.S. Pat. No. 5,665,650.

TECHNICAL FIELD

The present invention relates to the manufacture of electronic circuit assemblies and, more particularly, to the manufacture of circuit assemblies having electrical circuits disposed as a plurality of layers separated by dielectric material.

BACKGROUND OF THE INVENTION

High density circuit assemblies are typically formed as sequentially added layers of circuitry on printed circuit boards (PCBs), metal sheets, ceramic substrates, and the like. Such assemblies are typically formed by full additive metalization, for example, by electroless or electrolytic plating or vacuum deposition. Full metalization processes are time consuming and suffer yield problems due to the inherent thickness non-uniformity of the circuitry. Also, it is generally necessary to drill through holes and blind vias as separate intermediate operations during the manufacturing process, adding to the cost of manufacture.

U.S. Pat. No. 5,260,518, issued to Tanaka, discloses a method for forming multi-layer circuit boards in which stepped holes, increasing in diameter from lower to upper conductive layers, are bored or drilled during manufacture of the assembly. The holes provide conductive interconnection between electrical circuits disposed on different layers of the assembly. The increasingly larger diameters of the holes are required to solve the problem of misregistration of the holes when the layers are laminated. This not only increases the cost and complexity of manufacture, but the larger holes also limit the spacing, or density, of interconnection sites in the electronic circuit assembly. The circuits have lower component density, which requires larger board areas and increases the overall size of the assembly.

Other methods of forming multiple-layered electronic circuit assemblies require adhesive materials to bond the electrically conductive circuit layers to dielectric materials that separate the circuit layers. U.S. Pat. No. 4,420,364, issued to Nukii, describes the use of high-insulation adhesive sheets in the construction of multiple layer circuit assemblies. U.S. Pat. No. 5,234,536, issued to Parthasarathi, discloses the use of adhesive materials to bond a metal foil layer to a substrate. In each of these constructions, holes must be provided through the adhesive materials so that selected portions of separated circuit layers can be interconnected. These holes must be sufficiently large so that adhesive reflow during lamination does not occlude the interconnection site. When relatively large holes are required for circuit interconnection, the density of vias and other interconnection sites is limited. Electronic circuit assemblies formed through the use of adhesive bonding materials generally require more space for positioning of components, producing relatively large board areas and increased size of electronic circuits formed thereon.

U.S. Pat. No. 5,665,650, issued to Lauffer and incorporated herein by reference, discloses a method for manufacturing multiple layered electronic circuit assemblies that does not require adhesive bonding materials or stepped holes of increasing diameter to provide for conductive interconnection between electrical circuits. Because the via and inter-connection holes through the dielectric material can be relatively small, high-density circuitry on the circuit layers can be formed. The manufacturing system for the formation of multiple-layered, high-density electronic circuit assemblies is economical and easily automated so that previous problems with registration of respective circuits on spaced-apart layers are reduced.

Because one or more photoimageable dielectric layers and one or more electrically conductive layers are sequentially laminated to a preformed multi-layer printed circuit board during manufacture, however, a problem arises during via definition or filling. This problem typically causes the entire multi-layer structure, which includes the substrate and all the attached layers, to be scrapped. Thus, a need exists for a method that retains all of the advantages of this method, but does not require that the entire multi-layer structure be scrapped when a problem occurs during manufacture.

SUMMARY OF THE INVENTION

To meet this and other needs, and in view of its purposes, in one embodiment the present invention provides a method for manufacturing an electronic circuit assembly, the method comprising:

a) applying a layer of dielectric material to a surface of an electrically conductive layer to form an assembly;

b) forming vias in the layer of dielectric material;

c) filling the vias with a conductive material; and d) attaching the assembly to a substrate, the layer of dielectric material being disposed between the electrically conductive layer and the substrate.

In a preferred embodiment of the invention, the dielectric material is a dry film photoimageable dielectric material, which is exposed and developed to form vias, and the electrically conductive layer is copper.

This method is especially suited for the manufacture of high-density assemblies in which the components must be closely spaced. This method retains all of the advantages of the method of Lauffer discussed above. Because the vias are formed and filled before the dielectric layer is attached to the substrate, however, it is not necessary to scrap the entire multi-layer structure, which includes the substrate and all the attached layers, when a problem occurs during via formation or filling. This increases the overall yield for the entire circuit assembly manufacturing process.

In addition, the electrically conductive layer/dielectric material assembly can be produced in a roll-to-roll process, thus simplifying the manufacturing process.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Multiple layered, high-density electronic circuit assemblies, or boards, typically comprise a plurality of electronic circuits arranged in layers that are separated by layers of dielectric material that have appropriate holes, or vias, each of which provide for electrical inter-connection between circuits on other layers. Vias are also provided that provide electrical connection with components, such as semiconductor chips or chip carriers, which are mounted on the surface of the circuit assembly.

A multi-layer organic chip carrier is fabricated by attaching to a substrate an assembly consisting of an electrically conductive layer and a patterned b-stage dielectric material. The dielectric material, which is in contact with the substrate, has via openings filled with a conductive material. After the assembly has been attached to the substrate, the electrically conductive layer is patterned to define the desired circuit configuration.

After the desired circuit configuration has been formed, the process can be repeated as many times as necessary to create the desired number of fine-line circuit patterns. An additional assembly is attached to the circuitized conductive material with the dielectric material in contact with the conductive material and the conductive material of the additional assembly circuitized as described above. One or more assemblies may be laminated either to one or to both surfaces of the substrate.

Figure 1A:
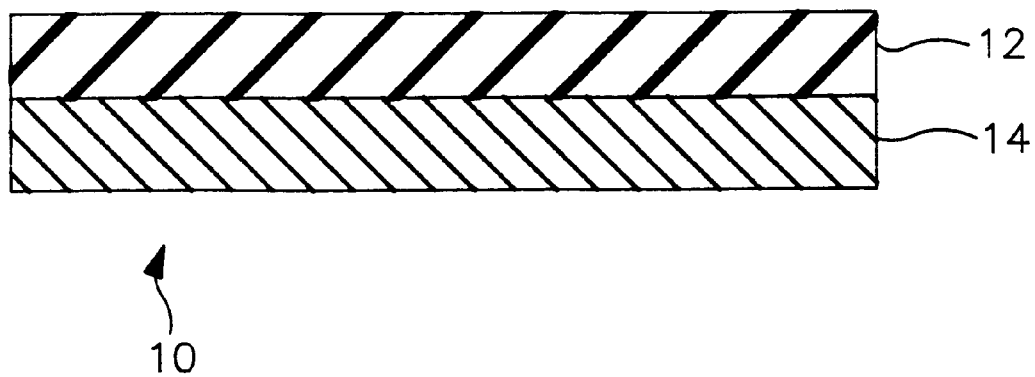
FIGS. 1(*a*), 1(*b*), 1(*c*), and 1(*d*) combine to provide a sequentially arranged schematic diagram of cross-sections of an electronic circuit assembly, showing sequential formation of the circuit assembly formed by a preferred embodiment of the present invention.
Figure 2:
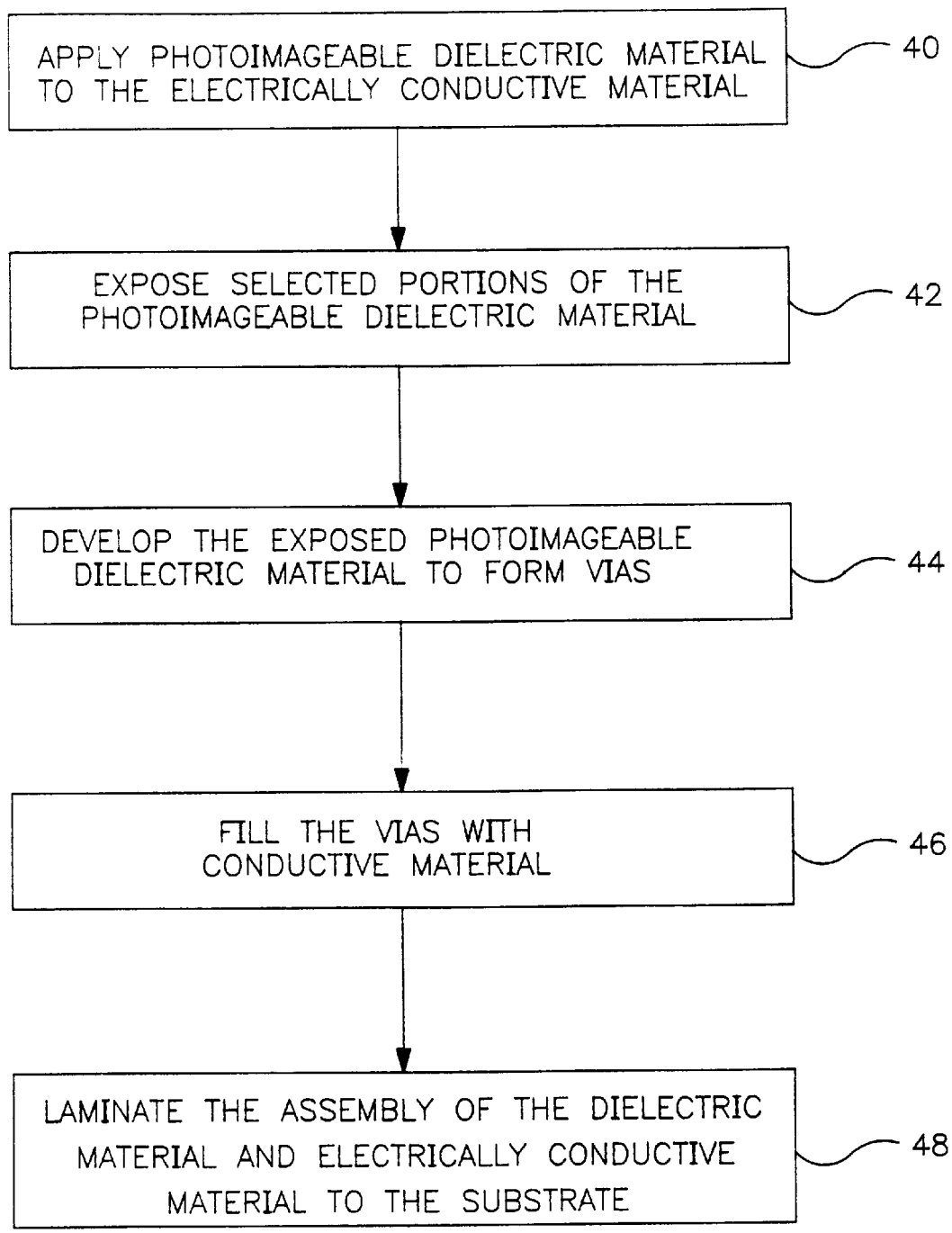
FIG. 2 is a block diagram illustrating the sequential steps carried out in the formation of an electronic circuit assembly formed by a preferred embodiment of the present invention.

In the preferred embodiment of the invention, an electronic circuit assembly, or board, is manufactured by the steps indicated in FIG. 2. As indicated by step 40 and shown in FIG. 1(a), in the first step of the method, a layer of dielectric material 12 is formed by applying a photoimageable dielectric material to one side of an electrically conductive layer 14 to form an assembly 10. A typical electrically conductive layer is a 0.5 to 1 ounce copper foil, having a thickness of about 0.7 mils (18 $\mu$m) to 1.4 mils (36 $\mu$m).

A dry film photoimageable dielectric material (PDM), such as Advanced SolderMask (ASM) available from International Business Machines Corporation, which is described in U.S. Pat. No. 5,026,624 and U.S. Pat. No. 5,300,402, is preferred. Other suitable dry film photoimageable dielectric materials include, among others, Vacrel® and Vialux® dry film photoimageable dielectrics produced by DuPont. Dry film photoimageable dielectric materials are typically applied by vacuum or hot roll lamination of the dielectric material to the conductive material. Layer of dielectric material 12 is typically about 0.001 inches (25 $\mu$m) to about 0.005 inches (130 $\mu$m) thick, preferably 0.001 inches (25 $\mu$m) to 0.003 inches (75 $\mu$m).

Liquid photoimageable dielectric materials can also be used to form layer of dielectric material 12. IBM's Advanced SolderMask (ASM) in liquid form is preferred. Other suitable liquid photoimageable dielectric materials include, among others, PSR4000 produced by Taiyo, and Probimer® liquid photoimageable dielectric produced by Ciba-Geigy. Liquid photoimageable dielectric materials can be applied by screen coating, roller coating, curtain coating, knife coating, reverse roll coating, dip coating, brushing, spray coating, or by any other conventional coating method.

Desirably, the coating of photoimageable dielectric material is heated, typically to a temperature of about 257° F. (125° C.) for about 30 minutes, to remove traces of solvents. Although heating may cause partial curing of the photoimageable dielectric material, the material must not be completely cured by this process. If the material is completely cured, vias cannot be formed in subsequent steps.

Figure 1B:
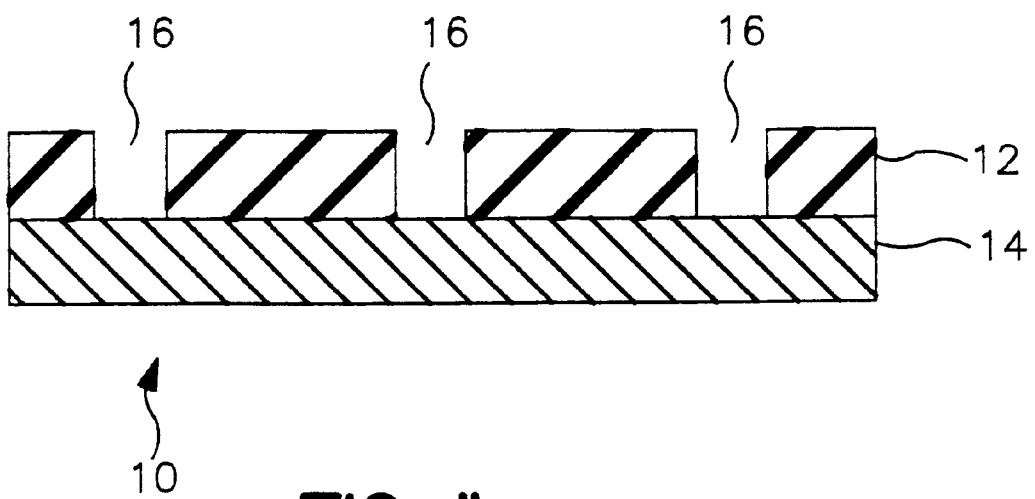

As indicated by steps 42 and 44, a series of defined open surface areas, known as vias, is defined in the dielectric material by standard photolithography processes. Following attachment to electrically conductive layer 14, selected portions of the layer of photoimageable dielectric material 12 are exposed to actinic radiation, and the unexposed portions of layer of dielectric material 12 are developed away exposing the conductive material and forming vias. FIG. 1(b) shows assembly 10 consisting of electrically conductive layer 14 and layer of dielectric material 12. Vias 16 have been formed in layer of dielectric material 12.

Actinic radiation is radiation that is active to form an image which can be developed to form vias in the photoimageable dielectric material. The radiation can be natural or artificial, monochromatic or polychromatic, incoherent or coherent, and for high efficiency should correspond closely to the wavelength or wavelengths of absorption of the photoinitiator system present in the photoimageable dielectric material.

Alternatively, non-photoimageable dielectric materials, such as polytetrafluoroethylene (PTFE) or similar fluorinated or per-fluorinated dielectric polymers, or b-staged epoxy, can be used in layer of dielectric material 12. Resin-coated copper, commercially available from Allied Signal, which consists of a copper foil coated with a c-stage epoxy followed by a b-stage epoxy, may be used as the conductive material/dielectric material assembly 10. With non-photoimageable dielectric materials, vias 16 may be defined, for example, by laser ablation of the dielectric material, or by plasma etching of the dielectric material through a stainless steel or molybdenum mask held in intimate contact with the dielectric layer during processing or by other suitable techniques.

Figure 1C:
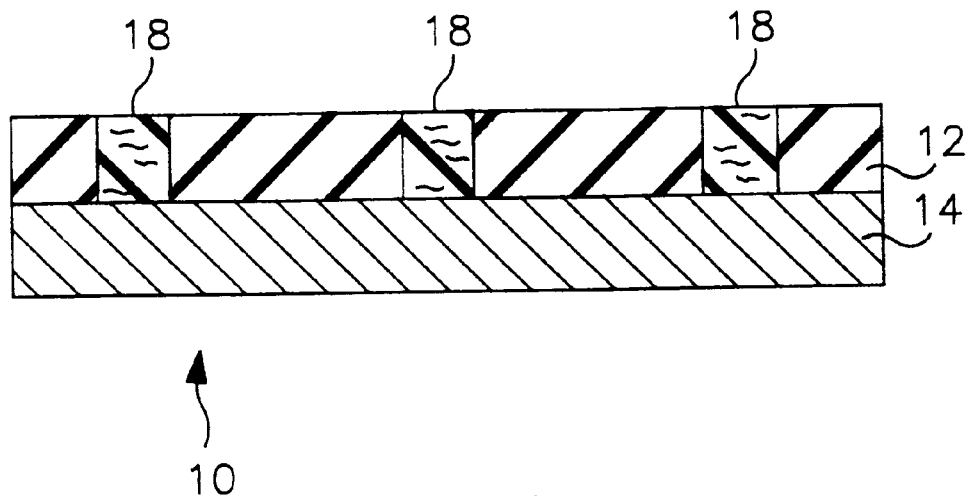
Figure 1D:
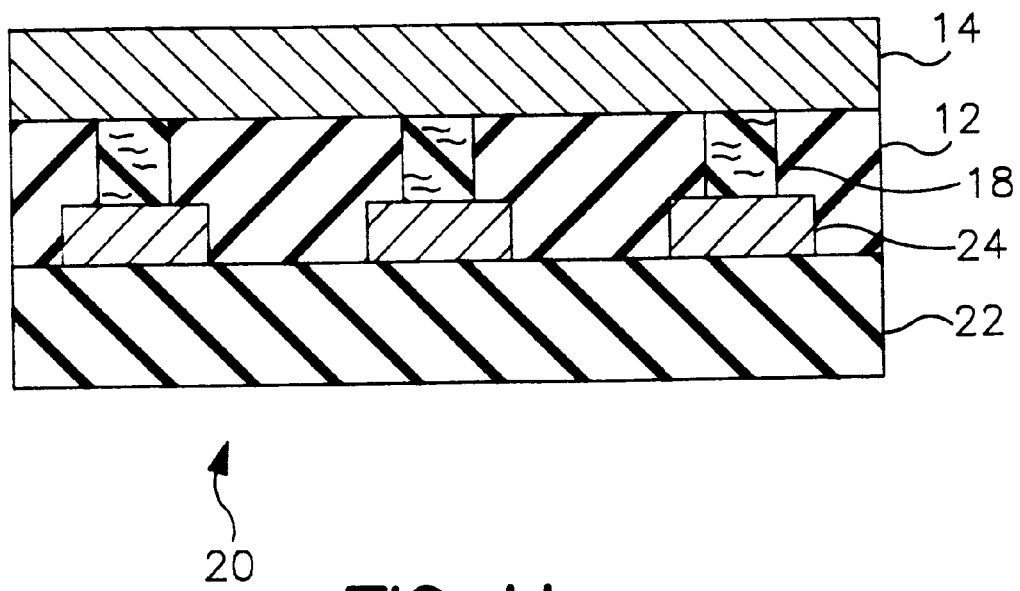

As indicated by step 46, the via openings of the dielectric layer are filled with conductive paste material. The paste material may be applied by any suitable method, such as, for example, by conventional screen printing, stencil, or injection printing. FIG. 1(c) shows assembly 10 consisting of electrically conductive layer 14 and layer of dielectric material 12, in which the vias have been filled with conductive paste material 18.

Conductive paste material 18 is typically a copper, silver, or gold filled thermoset polymeric material. Reflowable materials, such as conventional solder pastes, plated tin/lead or plated gold/tin/gold may also be used. The latter would typically be used with a high-temperature substrate and dielectric materials, such as fluorinated and perfluorinated polymers, including polytetrafluoroethylene and tetrafluoroethylene/hexafluoropropylene copolymers.

In a preferred embodiment, the previously defined process steps can be performed in a roll-to-roll process. The resulting electrically conductive layer/dielectric material subassembly, which comprises vias filled with conductive paste material, is separated into sheets prior to the next process step.

As indicated by step 48, the electrically conductive layer/ dielectric material sub-assembly with vias filled with conductive paste material, shown in FIG. 1(*c*), is laminated in a lamination press to the surface of a substrate, with the layer of dielectric material being disposed between electrically conductive layer 14 and the substrate. The substrate can be a preprinted circuit board, a metal or ceramic plate, or other structure. FIG. 1(*d*) shows electronic circuit assembly 20 consisting of substrate 22, circuit layer 24, layer of dielectric material 12 in which vias 16 have been filled with conductive paste material 18, and electrically conductive layer 14.

During the lamination process, the dielectric material is flowed and cured to provide adherence to substrate 22, while conductive paste material 18 creates an electrical interconnection between circuit layer 24 on substrate 22 and electrically conductive layer 14. Although the photoimageable dielectric material may have been partially cured during solvent removal following coating, the lamination temperature and pressure are sufficient to provide full cure of the dielectric and paste materials. The photoimageable dielectric material is substantially fully cured at the conclusion of the lamination process.

If desired, following lamination of assembly 10 to substrate 22, electrically conductive layer 14 may be thinned, for example, by fluid head etch methods or other suitable processes. This step would be carried out only if finer circuit lines were desired or if a thicker electrically conductive layer had been used initially to ease handling during application of layer of dielectric material 12 and during formation and filling of vias 16.

To form defined circuit patterns, electrically conductive layer 14 is circuitized using any conventional photoresist process and any conventional subtractive etching process. Photoresist processes apply a light-sensitive coating that is selectively exposed and developed prior to chemical etching. In negative-working photoresists, the exposed areas remain after development and serve as a mask for selective etching of the electrically conductive layer. In positive-working photoresists, the exposed areas are removed during development; the unexposed areas remain and serve as a mask for selective etching of the electrically conductive layer.

After the etching step, the remaining areas of photoresist are removed. The remaining areas of electrically conductive layer 14 define the desired circuit pattern, having such elements as the designated chip attachment sites and fan-out wiring, or full package wiring in thermal substrate applications. The term "chip" is used in a broad sense, and may comprise either a semiconductor chip, a semiconductor chip carrier, or other component, such as a resistor, connector, and the like, that is directly attached to the surface of a circuit board.

Figure 3:
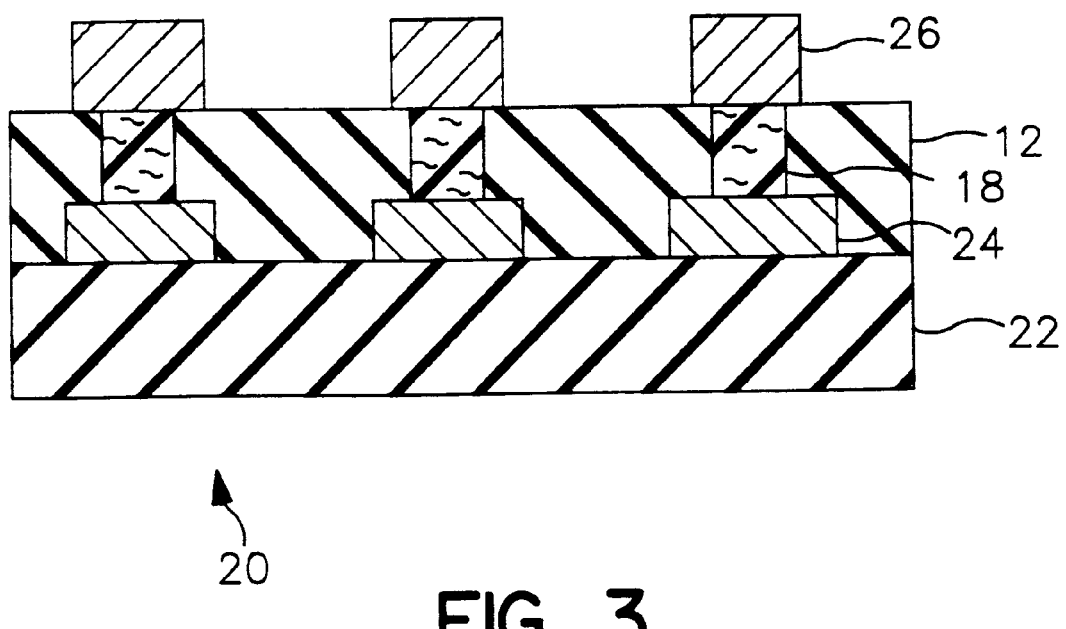
FIG. 3 is a schematic diagram of a cross-section of the electronic circuit assembly formed by a preferred embodiment of the present invention.

During the etching process, areas directly above the dielectric vias may also be etched if it is desired to provide a straight via opening through one or more of the layers of dielectric material. The resulting electronic circuit assembly 20, after etching to form the desired circuit features, is represented schematically in FIG. 3. FIG. 3 shows electronic circuit assembly 20 consisting of substrate 22, circuit layer 24, layer of dielectric material 12 in which the vias have been filled with conductive paste material 18, and the electrically conductive layer which has been circuitized to form circuit features 26.

For certain applications, the electronic circuit assembly is ready to continue conventional processing. In other applications, however, it may be desirable to provide planar surface lands to which the surface components can be directly attached. The method for forming chip attachment sites on a previously formed circuit board and attaching components to the circuit board, which includes filling predefined voids with an electrically conductive paste, laminating an electrically conductive layer onto the board, forming planar surface lands at each of the designated voids (thus providing planar chip attachment sites), and attaching components to the planar surface lands is described in Lauffer, U.S. Pat. No. 5,665,650, column 5, line 16, to column 6, line 65, incorporated herein by reference.

INDUSTRIAL APPLICABILITY

The method for manufacturing high-density electronic circuit assemblies according to the present invention is also easily applied to low- and medium-density external patterns where there is room for plated vias making interconnections to exposed surface features. The present invention is also applicable to organic chip modules or other flip chip, direct chip attachment applications. The wireability required for direct chip attachment is easily achieved by multi-level wiring. High-density electronic circuit assemblies are used in electronic devices, especially in digital computers.

The present invention is described in terms of its preferred embodiments. Nevertheless, those skilled in the art will recognize that changes in dielectric materials, in electrically conductive circuit material, electrically conductive paste material, and process methods may be made, and that via openings and interconnection holes may have other arrangements than those described and illustrated herein, consistent with the specifically stated required properties and without departing from the spirit of the invention.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for manufacturing an electronic circuit assembly, the method comprising:
   a) applying a layer of dielectric material to a surface of an electrically conductive layer to form a sub-assembly;
   b) forming vias in the layer of dielectric material;
   c) filling the vias with a conductive material; and
   d) attaching the sub-assembly comprising the layer of dielectric material and the electrically conductive layer to a substrate, the layer of dielectric material being disposed between the electrically conductive layer and the substrate.

2. The method of claim 1 in which the dielectric material is a photoimageable dielectric material, and step b) comprises, in order, the steps of:
   b1) exposing selected portions of the photoimageable dielectric material; and
   b2) developing the exposed photoimageable dielectric material to form the vias.

3. The method of claim 2 in which the dielectric material is a dry film photoimageable dielectric material.

4. The method of claim 3 in which the sub-assembly comprising the layer of dielectric material and the electrically conductive layer is laminated to the substrate.

5. The method of claim 4 in which the conductive material is copper.

6. The method of claim 2 in which the dielectric material is a liquid photoimageable material.

7. The method of claim 6 in which the liquid photoimageable material is applied by one of screen coating, roller coating, curtain coating, knife coating, reverse roll coating, dip coating, brushing, and spray coating.

8. The method of claim 7 in which the conductive material is copper.

9. The method of claim 1 in which the dielectric material is epoxy.

10. The method of claim 1 in which the dielectric material comprises a fluorinated polymer or perfluorinated polymer.

11. The method of claim 1 in which the vias are formed by one of laser ablation of the dielectric material and plasma etching of the dielectric material.

12. The method of claim 1 in which the conductive material is copper.

13. The method of claim 1 additionally comprising, following step d), the step e) of cicuitizing the electrically conductive layer.

14. The method of claim 13 in which the dielectric layer is a photoimageable dielectric material, and step b) comprises, in order, the steps of:
   b1) exposing selected portions of the photoimageable dielectric material; and
   b2) developing the exposed photoimageable dielectric material to form the vias.

15. The method of claim 13 additionally comprising, following step e), the step f) of attaching a second electronic sub-assembly to the electrically conductive layer.

16. The method of claim 15 in which the dielectric layer is a photoimageable dielectric material, and step b) comprises, in order, the steps of:
   b1) exposing selected portions of the photoimageable dielectric material; and
   b2) developing the exposed photoimageable dielectric material to form the vias.

17. The method of claim 16 in which the photoimageable dielectric material is a dry film photoimageable dielectric material and in which the conductive material is copper.

18. The method of claim 13 additionally comprising the step of providing planar surface lands on the electronic circuit sub-assembly.

19. The method of claim 18 in which the dielectric layer is a photoimageable dielectric material, and step b) comprises, in order, the steps of:
   b1) exposing selected portions of the photoimageable dielectric material; and
   b2) developing the exposed photoimageable dielectric material to form the vias.

20. The method of claim 1 in which the substrate is a preprinted circuit board.

21. The method of claim 20 in which the dielectric layer is a photoimageable dielectric material, and step b) comprises, in order, the steps of:
   b1) exposing selected portions of the photoimageable dielectric material; and
   b2) developing the exposed photoimageable dielectric material to form the vias.

22. The method of claim 1 in which the substrate is one of a metal plate or a ceramic plate.

23. The method of claim 22 in which the dielectric layer is a photoimageable dielectric material, and step b) comprises, in order, the steps of:
   b1) exposing selected portions of the photoimageable dielectric material; and
   b2) developing the exposed photoimageable dielectric material to form the vias.

24. An electronic circuit sub-assembly formed by the method comprising:
   a) applying a layer of photoimageable dielectric material to a surface of an electrically conductive layer to form an assembly;
   b) forming vias in the layer of dielectric material by, in order, exposing selected portions of the photoimageable dielectric material then developing the exposed photoimageable dielectric material to form the vias; and
   c) filling the vias with a conductive material.

25. The electronic circuit sub-assembly of claim 24 in which the photoimageable dielectric material is a dry film photoimageable dielectric material and in which the conductive material is copper.

26. An electronic circuit sub-assembly consisting of an electrically conductive layer and a layer of photoimageable dielectric material applied thereto, in which the sub-assembly comprises at least one via filled with a conductive paste material.

27. The electronic circuit sub-assembly of claim 26 in which the electrically conductive material is copper.

28. The electronic circuit sub-assembly of claim 26 in which the dielectric material is a dry film photoimageable dielectric material.

29. The electronic sub-assembly of claim 26 in which the dielectric material is a liquid photoimageable dielectric material.

* * * * *